United States Patent
Lim et al.

[19]

[11] Patent Number: 5,951,702
[45] Date of Patent: Sep. 14, 1999

[54] RAM-LIKE TEST STRUCTURE SUPERIMPOSED OVER ROWS OF MACROCELLS WITH ADDED DIFFERENTIAL PASS TRANSISTORS IN A CPU

[75] Inventors: Hank Lim, Mountain View; Earl T. Cohen, Fremont; Peter J. Vigil, San Jose; Jengwei Pan, San Jose; James S. Blomgren, San Jose, all of Calif.

[73] Assignee: S3 Incorporated, Santa Clara, Calif.

[21] Appl. No.: 08/832,922

[22] Filed: Apr. 4, 1997

[51] Int. Cl.[6] .............................. G11C 29/00; C11C 7/00
[52] U.S. Cl. ............................. 714/718; 365/200
[58] Field of Search .................... 371/21.1, 21.2, 371/21.4, 22.1, 22.2; 365/200, 201, 190; 395/183.18, 185.07; 364/265.3

[56] References Cited

U.S. PATENT DOCUMENTS

| | | | |
|---|---|---|---|
| 5,303,197 | 4/1994 | Miyashita et al. | 365/201 |
| 5,305,264 | 4/1994 | Takahashi | 365/190 |
| 5,406,216 | 4/1995 | Millman et al. | 327/202 |
| 5,414,714 | 5/1995 | Gladden et al. | 371/22.3 |
| 5,450,418 | 9/1995 | Ganapathy | 371/24 |
| 5,463,338 | 10/1995 | Yurash | 327/202 |
| 5,517,451 | 5/1996 | Okuzawa | 365/201 |
| 5,559,745 | 9/1996 | Banik | 365/201 |

*Primary Examiner*—Trinh L. Tu
*Attorney, Agent, or Firm*—Fenwick & West LLP

[57] ABSTRACT

A test structure is added to a microprocessor. The test structure is a RAM-like array of scan-clock word lines which selects a row of macrocells to be read or written. Perpendicular to the scan-clock word lines and the rows of macrocells are scan-data bit lines. Each testable macrocell has true and complement signal nodes that are connected to a pair of scan-data bit lines through a pair of n-channel pass transistors. The gates of the pass transistors are controlled by the scan-clock word line. The true and complement signal nodes are the cross-coupled inverters or gates in a latch. The latch is written or loaded by driving opposite data values onto the pair of scan-data bit lines when the pass transistors are activated by the scan-clock word line. The macrocells have random widths and thus do not form regular columns, so the columns of scan-data bit lines must be expanded to accommodate the various macrocell widths. Non-storage macrocells such as logic gates and buffers can be read but not written using the pass transistors connected to true and complement nodes in the macrocell. Reading causes a small voltage difference to be generated on the scan-data bit lines which is sensed by a sense amplifier. Only two n-channel transistors are added to a macrocell to make the macrocell testable. Thus testing is added with minimal area, cost, and delay to the macrocell.

18 Claims, 7 Drawing Sheets

RAM-LIKE TEST STRUCTURE SUPERIMPOSED OVER ROWS OF MACROCELLS WITH ADDED DIFFERENTIAL PASS TRANSISTORS IN A CPU

BACKGROUND OF THE INVENTION

1. FIELD OF THE INVENTION

This invention relates to testing of complex integrated circuits, and more particularly to integrated test structures in a microprocessor.

2. DESCRIPTION OF THE RELATED ART

Integrated circuits (IC's) such as microprocessors are increasing in complexity at a dizzying pace. A central processing unit (CPU) or microprocessor can easily have over a million transistors, all of which must function properly. Ideally, each transistor and each wiring connection should be tested at the factory before the microprocessor chip is sold to a computer manufacturer.

Since the microprocessor chip may have only a few hundred input/output (I/O) pins, most of the transistors to be tested are deeply embedded in the chip. Often complex sequences of test vectors or stimuli must be input to the chip to test embedded circuitry. These complex test sequences increase the amount of time a chip spends on a test machine and thus increases test cost, which is a significant fraction of the total cost of a chip.

Circuitry is often added to complex IC's to improve testability. This test circuitry provides a more direct path to deeply embedded circuits so that test stimuli can be more directly applied to the embedded circuitry. Test circuitry also routes the outputs of deeply embedded circuits to the I/O pins. Special automatic-test-program-generator (ATPG) software is used to create the test stimuli.

SCAN CHAINS

A common prior-art approach is to add a scan chain to a complex IC. Most of the flip-flops on the chip are modified to have additional test inputs and an additional test output. Each test input is directly connected to the test output of another flip-flop so that the flip-flops in the chip form a chain. See the examples in "Dual Latch Clocked LSSD and Method" by Yurash, U.S. Pat. No. 5,463,338 assigned to VLSI Technology, Inc. of San Jose, Calif.

A test-mode or scan clock is routed to each modified flip-flop. When the scan clock is pulsed, the data from one flip-flop is shifted to the next flip-flop in the chain, from the test output of one flip-flop to the test input of the next flip-flop. Data from any flip-flop in the scan chain can eventually be shifted to the end of the chain, which is connected to an I/O pad. Thus any flip-flop can be observed for test by pulsing the shift clock enough times. The microprocessor can be clocked using the normal CPU clock any number of times to bring the chip in to a desired state, and then the CPU clock is stopped and the scan clock is pulsed to shift out the scan chain.

Data can also be shifted into any flip-flop in the scan chain when another I/O pad is connected to the test input of the first flip-flop in the chain. Thus each modified flip-flop can be controlled and observed using scan chain techniques.

FIG. 1 illustrates a scan chain in a complex microprocessor chip. CPU core 14 is embedded in a larger chip, and is clocked during normal operation by a CPU clock CPUCLK. Many flip-flops in CPU core 14 are modified to have an additional test or scan input SI and a scan output SO. A test or scan clock SCLK is routed to each modified flip-flop 12. When CPUCLK is stopped and SCLK is pulsed, the SI input is loaded into flip-flop 12. Each modified flip-flop 12 has its scan output SO connected to the scan input SI of the next modified flip-flop 12. I/O pad 16 drives the SI input of the first flip-flop 12 in the chain, while the last flip-flop 12 has its SO coupled to drive I/O pad 18.

SCAN FLIP-FLOP—FIG. 2

FIG. 2 is a diagram of a flip-flop modified for testing in a scan chain. Flip-flop 12 has a master latch 20 and a slave latch 22. Together, master latch 20 and slave latch 22 form a standard edge-triggered flip-flop. Standard output Q from slave latch 22 changes on the rising edge of CPUCLK, while the output of master latch 20 changes when CPUCLK is low.

Multiplexer or mux 26 is added in front of the D input to master latch 20. Mux 26 connects the standard D input to master latch 20 during normal operation, but the scan-in input SI is connected to master latch 20 during test mode. A scan-enable signal TSEL controls mux 26 to select the test input during scan-test mode. When CPUCLK is paused in the low state, the scan input SI is loaded into master latch 20 during test mode to control the state of slave latch 22 on the next rising edge of CPUCLK.

Data is shifted through the scan chain when scan clock SCLK is pulsed, loading scan latch 24 with SI. NOR gate 19 inverts and passes SCLK or CPUCLK through to master latch 20. CPUCLK may be alternately pulsed with SCLK, or other clocking schemes may be used. Many variations are possible, such as using a single clock without a separate scan clock, or replacing scan latch 24 with a gate.

SCAN LATCH INCREASES AREA, COST, DELAYS

While inserting modified scan flip-flops into embedded circuitry greatly increases testability, the additional mux and scan latch can increase the chip die area and thus the cost. The performance of the microprocessor during normal operation can also be harmed due to the additional loading of the slave latch, and the longer wiring traces on the larger die.

SCAN CHAINS LONGER AS COMPLEXITY INCREASES

As the complexity of the IC increases, more flip-flops are used. Thus the length of the scan chain grows as more flip-flops need to be included in the chain. It is not unusual for a CPU core to have 10,000 flip flops. When all flip-flops are connected together in a long chain, a huge number of scan-clock cycles are needed to shift data in and out of the chain. When 10,000 clock cycles are required to load or read the state of the CPU core through the long scan chain, test time rapidly increases as more circuitry is tested. Clearing or presetting the flip-flops could require many cycles.

The scan chain can be split into several smaller links, but additional circuitry or I/O pins are needed. The large number of flip-flops also increases the loading and delay for SCLK. Another problem realized by the inventors is the power surge when SCLK is pulsed. Pulsing 10,000 flip-flops at the same time creates a di/dt problem resulting in severe ground bounce and possible loss of stored data.

NON-FLIP-FLOP TEST POINTS NOT TESTED

While the scan chain can load and observe flip-flops, testing and debugging is more efficient if other nodes on the circuit are directly observable. For example, the data value on an internal bus is useful to a debugger, but if the bus is not clocked into a flip-flop, the scan chain does not observe it. Thus internal signal nodes rather than just flip-flops are desirable as test points.

The scan chain is useful for fully synchronous designs using a strict clocking scheme, but circuit designers often break the rules. Speed-critical parts of the design may not use strict clocking and flip-flops, but instead use latches (half of a flip-flop). Cycle-stealing is common in very high speed design, where a latch rather than a full flip-flop is used to "steal" available path delay from a following stage. These and other design tricks do not fit easily into scan-chain testing.

What is desired is a test structure to observe and load latches as well as flip-flops. It is desired to eliminate the scan latch added to a flip-flop for scan-chain testing. It is desirable to observe non-storage nodes such as busses and signals using the same kind of test structure for testing flip-flops. It is desired that the test structure be a regular structure to minimize wiring lengths and propagation delays. It is desirable to eliminate long scan chains, but instead have smaller groups of test points which can be selected for testing. It is desired to reduce the current spike when the test clock is pulsed.

SUMMARY OF THE INVENTION

A test structure is for an integrated circuit with rows of macrocells. The test structure has a pair of pass transistors connected to each macrocell tested by the test structure. The pair of pass transistors is connected to a pair of complementary nodes in the macrocell. The pair of complementary nodes has opposite logical states during a test mode.

A plurality of test-mode word lines has each word line connected to control gates of the pair of pass transistors for macrocells in one of the rows of macrocells. A plurality of pairs of test-mode bit lines has each pair of test-mode bit lines connected to the pair of pass transistors for no more than one macrocell in each row of macrocells. The macrocells include flip-flop macrocells containing two storage latches, latch macrocells containing just one storage latch, logical-gate macrocells containing at least one logic gate but no storage latches, and buffer macrocells containing no storage latches.

A sensing means is connected to each pair of bit lines. It senses a voltage difference across the pair of bit lines and outputs a test output signal which represents a logical value corresponding to a logical state of a macrocell being read. Thus the test structure connects to macrocells through the pair of pass transistors. Flip-flop, latch, logical-gate, and buffer macrocells are tested by the test structure.

In further aspects of the invention only the pair of pass transistors are added to a macrocell for testing with the test structure. Thus only two transistors are added to each macrocell for testing. The sensing means is a sense amplifier for amplifying a small voltage difference of a few tenths of a volt.

In still further aspects a pre-charge means is coupled to each pair of bit lines to charge each bit line in each pair of bit lines to an intermediate voltage before a word line in the plurality of test-mode word lines is activated. The intermediate voltage is a voltage between a power-supply voltage and a ground. Thus the plurality of pairs of test-mode bit lines are pre-charged to the intermediate voltage prior to reading.

In further aspects each pair of pass transistors are two n-channel pass transistors with control gates connected to the word line and sources connected to the pair of bit lines.

In further aspects only one word line in the plurality of test-mode word lines is activated. Thus only one row of macrocells is read or written at a time in the rows of macrocells.

In other aspects the logical state of a logical-gate macrocell is not altered when a testmode write is signaled and the word line to the logical-gate macrocell is activated. Thus the logical-gate macrocell is observable but not loadable in the test mode. The logical-gate macrocells include macrocells for performing an AND logical function, an OR logical function, and an exclusive-OR (XOR) logical function. Thus AND, OR, XOR function macrocells are tested by the test structure.

In further aspects of the invention the plurality of pairs of bit lines are metal lines running in a perpendicular direction to the rows of macrocells. Each word line is a metal line running over a single row of macrocells. Thus the word lines are perpendicular to the pairs of bit lines. The macrocells have variable widths, so that the macrocells do not form constant-width columns of macrocells.

DETAILED DESCRIPTION

The present invention relates to an improvement in IC test structures. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

RAM-LIKE TEST ARRAY SUPERIMPOSED OVER RANDOM ASIC

The inventors have realized that the structure of a random-access memory (RAM) can be superimposed onto a random-logic application-specific integrated circuit (ASIC) to form an array-like test structure. The storage element of the RAM's memory cell is replaced by a standard library-cell or macrocell of an ASIC. The RAM-like test structure is used to access the macrocell for testing, and to transfer data either to the macrocell or from the macrocell.

Although a great many kinds of macrocells are used on an ASIC, the test structure is able to test the macrocells regardless of the specific macrocell type (flip-flop, latch, buffer, logic gate, etc.). In concept, the inventors swap the storage element of a RAM cell with a macrocell of almost any type.

While a RAM array contains identical memory cells, the ASIC 'array' contains many different types of macrocells. The RAM array's structure is stretched out to accommodate the various macrocells to form the test structure.

REVIEW OF PRIOR-ART RAM ARRAY

Figure 1:
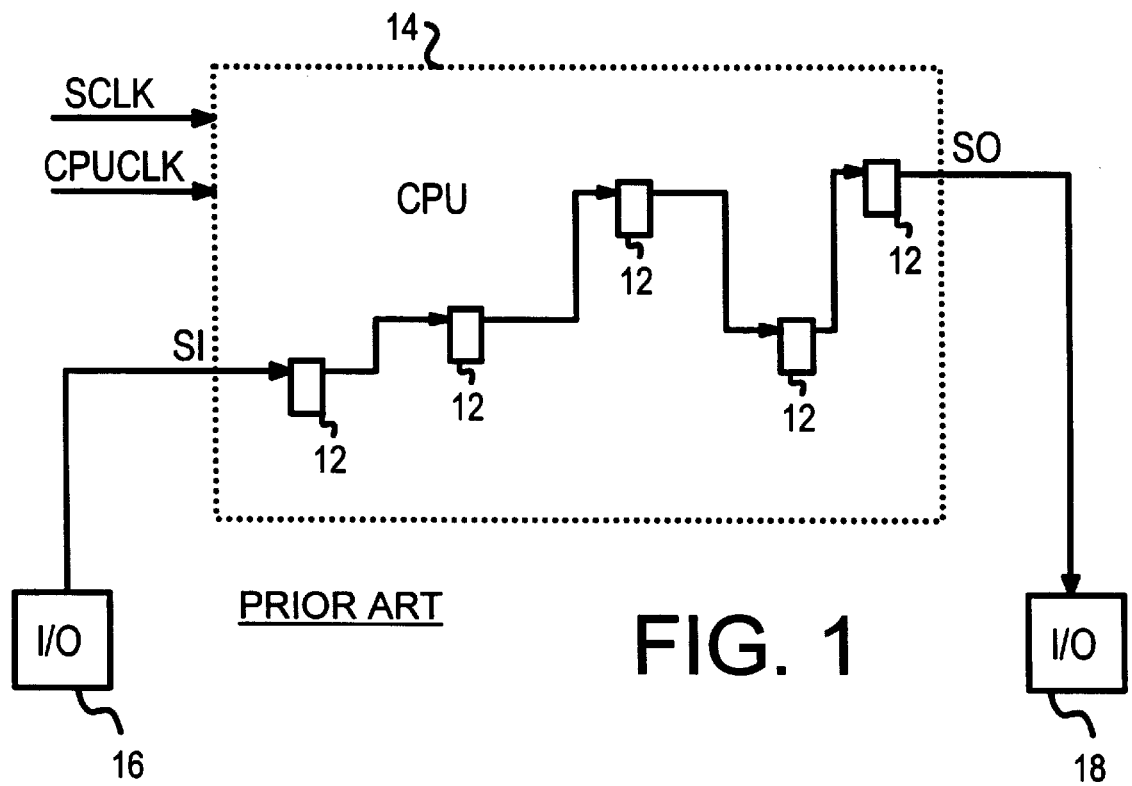
FIG. 1 illustrates a scan chain in a complex microprocessor chip.
Figure 2:
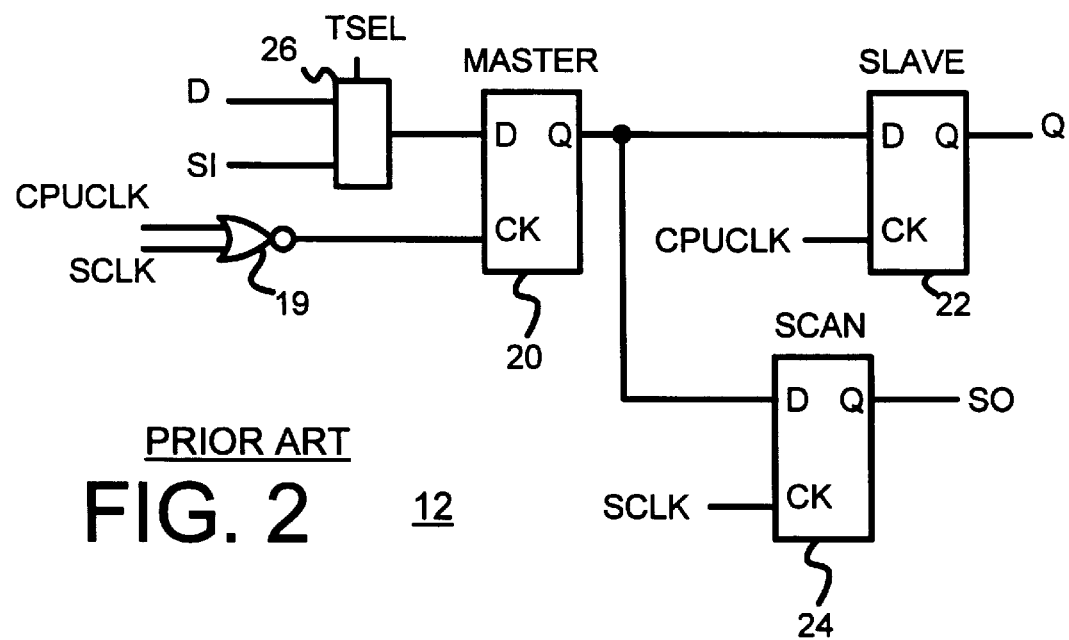
FIG. 2 is a diagram of a flip-flop modified for testing in a scan chain.
Figure 3:
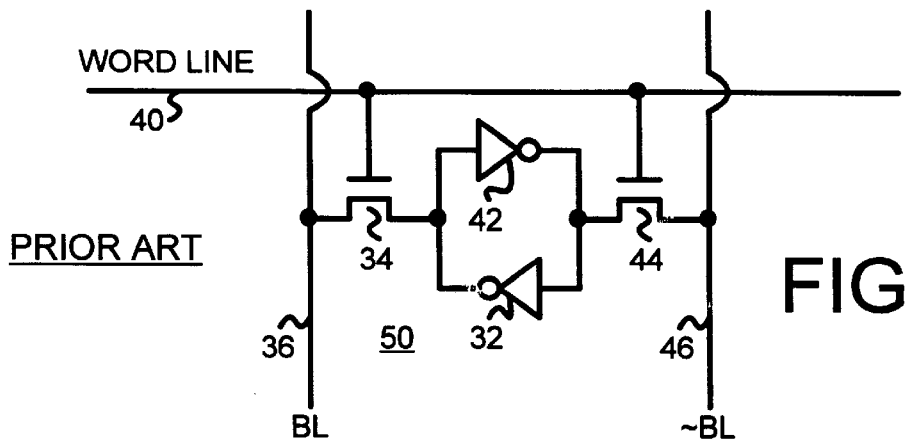
FIG. 3 is a diagram of a prior-art static RAM cell.

A review of a standard RAM is useful in explaining the concepts of the invention. FIG. 3 is a diagram of a prior-art static RAM cell 50. Inverters 32, 42 each have their output connected to the other inverter's input in a cross-coupled arrangement to form a storage element. One bit can be stored by inverters 32, 42. Pass transistors 34, 44 connect the storage element of inverters 32, 42 to bit lines 36, 46, one of which is driven to a low voltage when the cell is read. Reading the cell occurs when a high voltage is applied to row or word line 40 which causes pass transistors 34, 44 to conduct current or "turn on". Bit lines 36, 46 are initially pre-charged to an intermediate voltage such as Vdd minus an n-channel transistor threshold voltage.

Reading causes one of the two bit lines 36, 46 to be driven to a lower voltage while the other bit line remains at the intermediate voltage. The small difference in voltage on bit lines 36, 46 is amplified by a sense amp and output as the data bit read.

Figure 4:
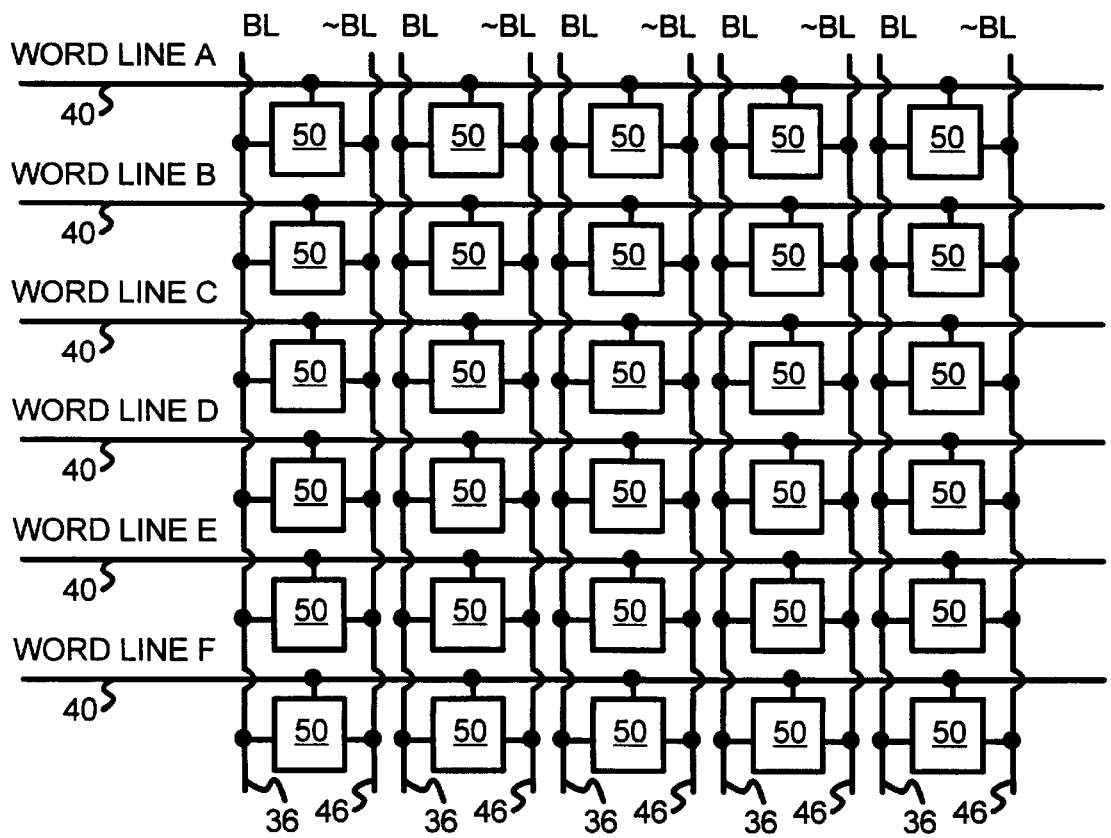
FIG. 4 is a prior-art RAM array.

FIG. 4 is a prior-art RAM array in which memory cell 50 is arrayed into rows and columns to form an array. Each word line 40 activates the pass transistors in a row of memory cells 50. Only one of the word lines is activated at any time; the other word lines are low so that only one row of memory cells 50 drives bit lines 36, 46 at any time.

Only one of the memory cells 50 in each column drives its bit lines 36, 46 at any time. A sense amp (not shown) is provided for each pair of bit lines 36, 46 to amplify the small voltage difference on bit lines 36, 46 produced by the reading of memory cell 50. Writing is accomplished by driving one of the bit lines high and the other bit line low when the pass transistors to a memory cell are on. Bit-line drivers (not shown) are provided to drive the bit lines during write. The bit-line drivers are much larger than the memory cell's transistors and easily over-power the cell's inverters to change the state of the memory cell.

MACROCELLS IN AN ASIC—FIG. 5

Figure 5:
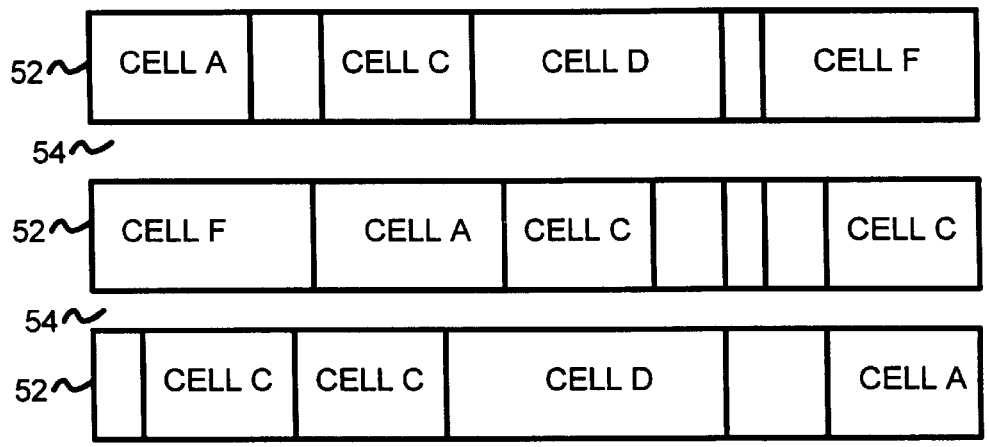
FIG. 5 is a diagram of various kinds of macrocells in an ASIC.

FIG. 5 is a diagram of various kinds of macrocells in an ASIC. While the RAM array of FIG. 4 has a regular, repeated structure, an ASIC contains many different kinds of macrocells arranged into rows 52 separated by wiring channels 54. Metal lines to connect macrocells in rows 52 are located in wiring channels 54. Since the interconnection required varies for different macrocells, wiring channels 54 usually vary in height. For example, a flip-flop macrocell requires clock, data and perhaps set and reset inputs, and has one or two outputs, while a 2-input NAND gate has only two inputs and one output. Some newer technologies reduce or eliminate wiring channels by using multiple layers of metal which run directly over active transistor areas of the macro cells in rows 52.

FIG. 5 shows that niacrocells have different widths, although a fixed height is often used to simplify layout. Macrocell A (CELL A) is narrower than macrocell D, because macrocell D contains more or larger transistors. For example, macrocell A could be a latch or an AND or OR gate, while macrocell D is a flip-flop or a large buffer.

RAM STRUCTURE SUPERIMPOSED OVER MACROCELLS

Figure 6:
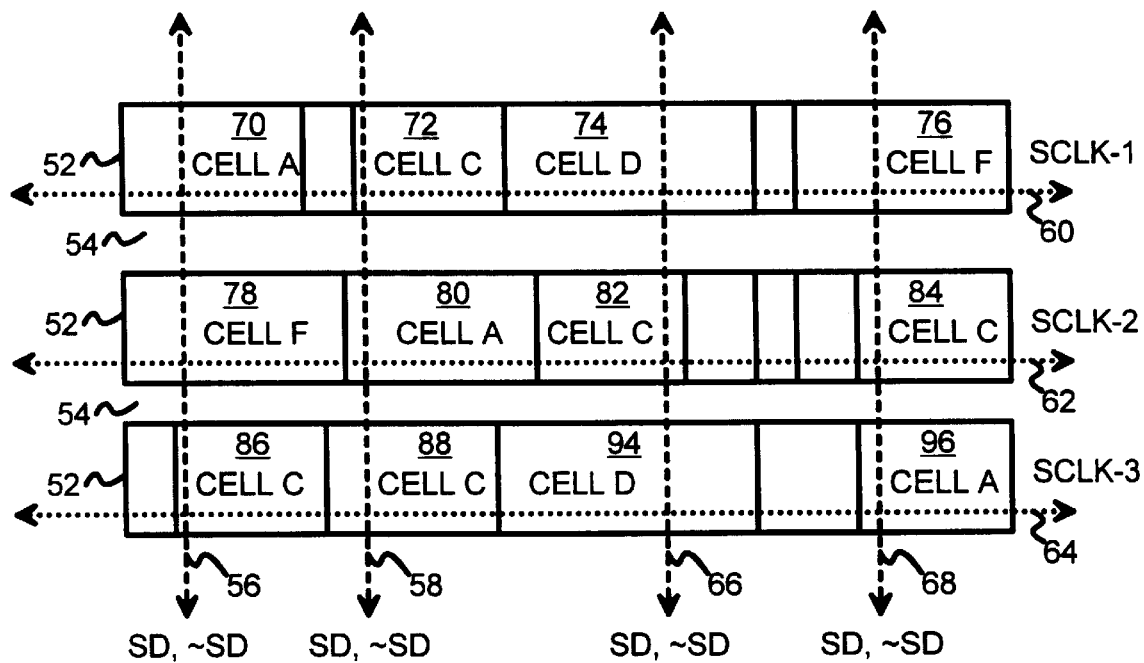
FIG. 6 shows word and bit lines of a RAM array placed over rows of macrocells in an ASIC.

FIG. 6 shows word and bit lines of a RAM array placed over rows of macrocells in an ASIC. The scan clock SCLK acts as a word line once it is decoded to select only one row of macrocells. The scan in and scan out connections of a macrocell are replaced with a differential pair of bidirectional scan data lines. The scan data lines act as bit lines. Scan-clock word lines 60, 62, 64 are placed over macrocell rows 52 and select macrocells in the underlying row for testing. Scan-clock word lines 60, 62, 64 run in the same direction as the macrocell rows.

NO REGULAR COLUMNS IN ASIC'S

Scan-data bit lines 56, 58, 66, 68 are placed over many rows of macrocells, crossing perpendicularly over wiring channels 54. Although the prior-art RAM array had distinct columns of memory cells, an ASIC does not have distinct columns of macrocells since each macrocell varies in width. Thus regular columns do not exist in an ASIC.

The lack of columns makes placement of bit lines difficult. Bit lines can be located at regular intervals, or where the desired test points lie. Place-and-route software can be modified to place bit lines at desired locations, or to adjust placement of macrocells to better fit into columns under a bit line. Short lateral connecting lines could also be used to connect from the bit line to the desired macrocell when the macrocell does not fall directly underneath a bit line.

Scan-data bit lines 68 connect to macrocells 76, 84, 96 in the first, second, and third rows of macrocells. Scan-data bit lines 68 are driven by macrocell F 76 in the first row when scan-clock word line 60 is activated. When the second row's scan-clock word line 62 is activated, macrocell C 84 drives the scan data lines. When the third row is selected by scan-clock word line 64, then macrocell A 96 drives the scan data lines.

A whole row of macrocells is read or written at the same time when selected. For example, when scan-clock word line 64 is activated, macrocell C 86 drives scan data lines 56, while macrocell C 88 drives scan data lines 58. Macrocell D 94 drives scan data lines 66, while macrocell A 96 drives scan data lines 68.

Each macrocell can perform a different logical function. For example, macrocell A 70, 80, 96 can be an AND cell containing a NAND gate and an inverter. Macrocell C 72, 82, 86, 84, 88 could be separate instances of an OR function, or perhaps an AND-OR-Invert function which AND's together two inputs and then OR's the result with a third input before inverting the result. Macrocell D 74, 94 is a flip-flop cell with a clock and a data input and a Q and Q inverse output from the slave latch. Some instances of macrocell D could have an additional set or reset input. Many other types of macrocells are known and could be substituted, such as inverting and non-inverting buffers, latches, other logic functions such as exclusive-OR, and custom functions.

MACROCELL TEST INPUTS CONNECTED TO PAIR OF TRANSISTORS

While prior-art scan chains used an input multiplexer and a scan latch or scan-output buffer, the invention has eliminated the mux and scan latch or scan-output buffer and replaced these with a pair of n-channel transistors. The prior-art used mono-directional test ports: an input and an output. The invention uses bi-directional test ports.

Figure 7:
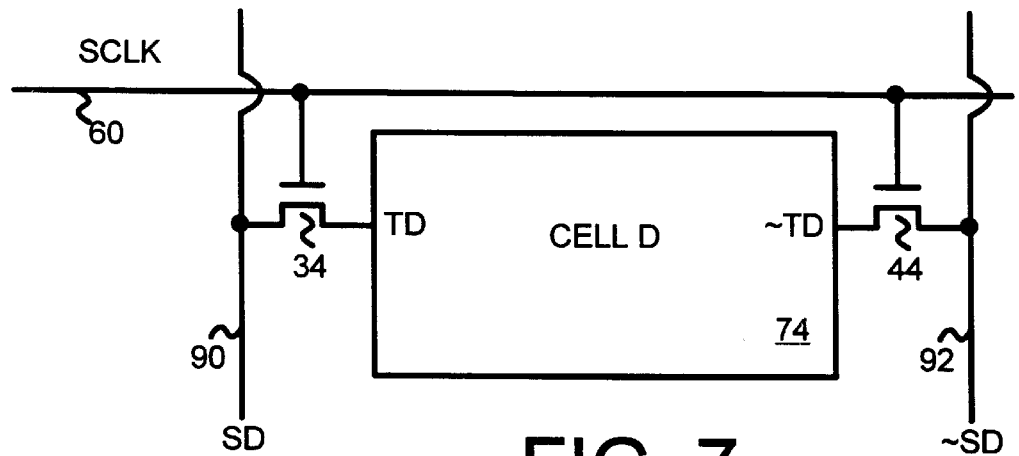
FIG. 7 highlights bi-directional test ports to a macrocell using a differential pair of transistors.

FIG. 7 highlights bi-directional test ports to a macrocell using a differential pair of transistors. Macrocell D 74 is any of a wide variety of macrocells performing varied logical and storage functions. Two test ports are provided to macrocell D 74, labeled TD and ~TD. Test port ~TD is the logical inverse of test port TD under normal steady-state or equilibrium conditions.

Test port TD is connected to scan-data bit line 90 through n-channel pass transistor 34, while test port ~TD is connected to the other scan-data bit line 92 through a second n-channel pass transistor 44. The control gates of transistors 34, 44 are connected to scan-clock word line 60, which is the scan clock ANDed with a row decode. When SCLK is high and the row containing macrocell 74 is selected, scan-clock word line 60 is high, enabling transistors 34, 44 to conduct current.

Since the two test ports TD, ~TD are logical inverses of each other, one of the scan-data bit lines is pulled to a lower voltage and the other bit line remains at a higher voltage when transistors 34, 44 are enabled by scan-clock word line 60. An n-channel transistor is efficient at passing a low voltage through, but inefficient at passing a high voltage through. Thus scan-data bit lines 90, 92 are both equalized and precharged to the same voltage before reading. Some RAM designs actively bias the bit lines during read to a higher voltage, resulting in a smaller voltage differential being developed.

ONLY 2 TRANSISTORS ADDED TO TEST MACROCELL

Additional test circuitry inside macrocell D 74 is not required. Two nodes inside macrocell D 74 are chosen as test ports TD, ~TD. Thus the invention requires very little additional test circuitry: only the two n-channel transistors 34, 44 are added to each instance of a testable macrocell having true and complement signals.

The connection of the sources of transistors 34, 44 rather than the gates also reduces capacitve loading on the macrocell. Sources have about one-third of the capacitance of a gate, and thus the loading is reduced by connecting the n-channel transistor sources rather than gates to the macrocell's internal nodes.

Previous scan-test structures have required adding an input mux and an output buffer, and perhaps a scan-output latch. A mux is typically equivalent to two gates (eight transistors), while a latch is 2–4 more gates. The two n-channel transistors occupy an area smaller than one gate. Since n-channel transistors have a higher carrier mobility than p-channel transistors, n-channel transistors are smaller for a desired current drive. Thus using two n-channel transistors is much more efficient than adding a mux having four p-channel and four more n-channel transistors.

Since a macrocell's area is often limited by the larger p-channel transistors, free space is often available in the p-well for the two n-channel transistors 34, 44. Thus in many cases no additional area in the macrocell is required for adding the inventors' test structure. The invention is extremely miserly of silicon area as only two of the smaller n-channel transistors are added to make a macrocell testable.

TEST PORTS INSIDE MACROCELL—FIG. 8

Figure 8:
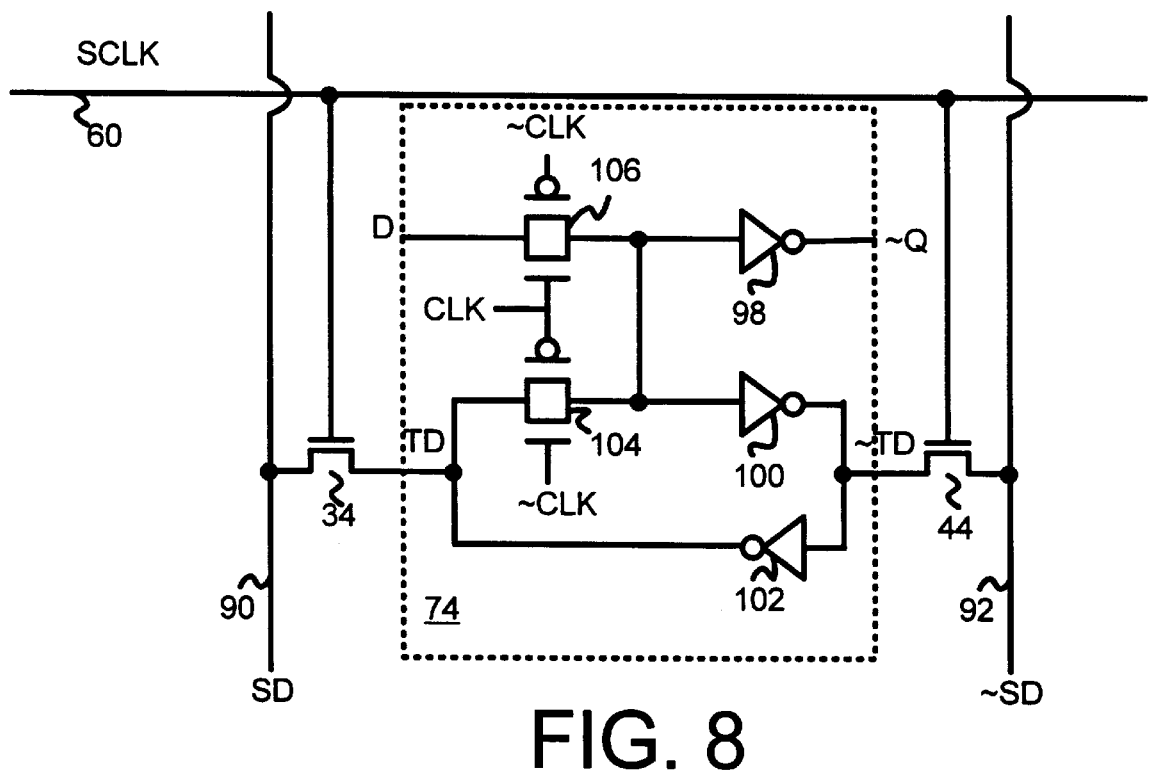
FIG. 8 illustrates test ports inside a macrocell connected to a differential pair of pass transistors in a superimposed test array.

FIG. 8 illustrates test ports inside a macrocell connected to a differential pair of pass transistors in a superimposed test array. Since test ports TD and ~TD are logical inverses of each other, nodes TD and ~TD must be separated by an inversion. Inverters 100, 102 separate test ports TD and ~TD. Inverters 100, 102 are cross-coupled inverters which form a storage node in macrocell D 74. Macrocell D 74 in this example is a level-sensitive latch, LATI. When clock input CLK is high, the latch is open and transmission gate 106 is open, connecting input D to output ~Q. The logic value of input D is passed through transmission gate 106 and inverted by inverter 100 to test port ~TD, and then inverted again by inverter 102 to test port TD. Transmission gate 104 is closed when clock CLK is high.

When CLK is low, transmission gate 106 is closed, and transmission gate 104 opens. The output of inverter 102 drives through transmission gate 104 to hold the input of inverter 100. When CLK is low, inverters 100, 102 are cross-coupled together and hold their state as a storage element as long as power continues to be applied.

TEST READ OPERATION

Reading the test ports of macrocell 74 can be performed when CLK is low or high. When the scan clock SCLK becomes high, and the row containing macrocell 74 is decoded, scan-clock word line 60 rises, enabling n-channel pass transistors. The logical state of test node TD is driven from inverter 102 through pass transistor 34 to scan-data bit line 90, while the logical state of test port ~TD is driven from inverter 100 through pass transistor 44 to scan-data bit line 92.

A read upset could occur if n-channel pass transistors 34, 44 were large in comparison to inverters 100, 102. The state stored in inverters 100, 102 could be reversed, causing the loss of stored data, as charge from scan-data bit lines 90, 92 is connected to test ports TD, ~TD when pass transistors 34, 44 are first opened. Pass transistors 34, 44 are therefore kept small in comparison to inverters 100, 102 to prevent read upset from occurring. The exact sizes of inverters 100, 102 and pass transistors 34, 44 are chosen by a transistor-level circuit simulation using software such as SPICE.

In one embodiment of a latch macrocell, transmission gate 104 has 1-micron-wide n-channel and p-channel transistors, while inverter 100 has 4-micron-wide p-channel and 2-micron-wide n-channel transistors. Inverter 102 is smaller, having 2-micron-wide p-channel and 1-micron-wide n-channel transistors. N-channel pass transistors 34, 44 are each 1-micron wide. Minimum channel lengths are used. Inverter 98 and transmission gate 106 are larger for higher speed in buffering signals to other macrocells.

Inverters 100, 102 do not have to drive scan-data bit lines 90, 92 fully to power and ground, since scan-data bit lines 90, 92 are connected to an analog sense amplifier rather than to a standard logic gate. The sense amplifier is able to sense a small voltage difference between bit line 90 and bit line 92 and amplify this detected difference to full logic levels. Sense amplifiers are well-known in the art of RAM design. A voltage difference of just a few tenths of a volt on bit lines 90, 92 is sufficient to sense the state of macrocell 74.

TEST WRITE OPERATION

Loading the macrocell with a desired initial value for a test sequence is accomplished by writing to the macrocell. The data to be written to macrocell 74 is driven onto scan-data bit line 90 while the inverse of the data written is driven onto scan-data bit line 92. When pass transistors 34, 44 are opened by scan-clock word line 60, the voltages on bit lines 90, 92 flip the state of the storage element of inverters 100, 102. For example, when scan-data bit line 90 is low and scan-data bit line 92 is high, pass transistor 34 pulls charge from test port TD until the voltage of node TD and the input to inverter 100 is low enough to drive the output of inverter 100 high rather than low.

Pass transistors 34, 44 must be sufficiently large relative to inverters 100, 102 for writing to be accomplished. Also, transmission gate 104 must be open, so clock input CLK must be in the low state. When CLK is high, the input of inverter 100 is isolated from test port TD and thus cannot be changed during a test write.

Of course, macrocells without a storage element cannot be written to, since upstream logic alone determines the logic state of the macrocell. Non-storage macrocells can only be read, not written. Attempting to write to a non-storage macrocell is not damaging since test write cycles are fairly short, so an entire row of macrocells can be written together, even when some macrocells are non-storage cells and cannot be written.

NON-STORAGE MACROCELL—FIG. 9

Figure 9:
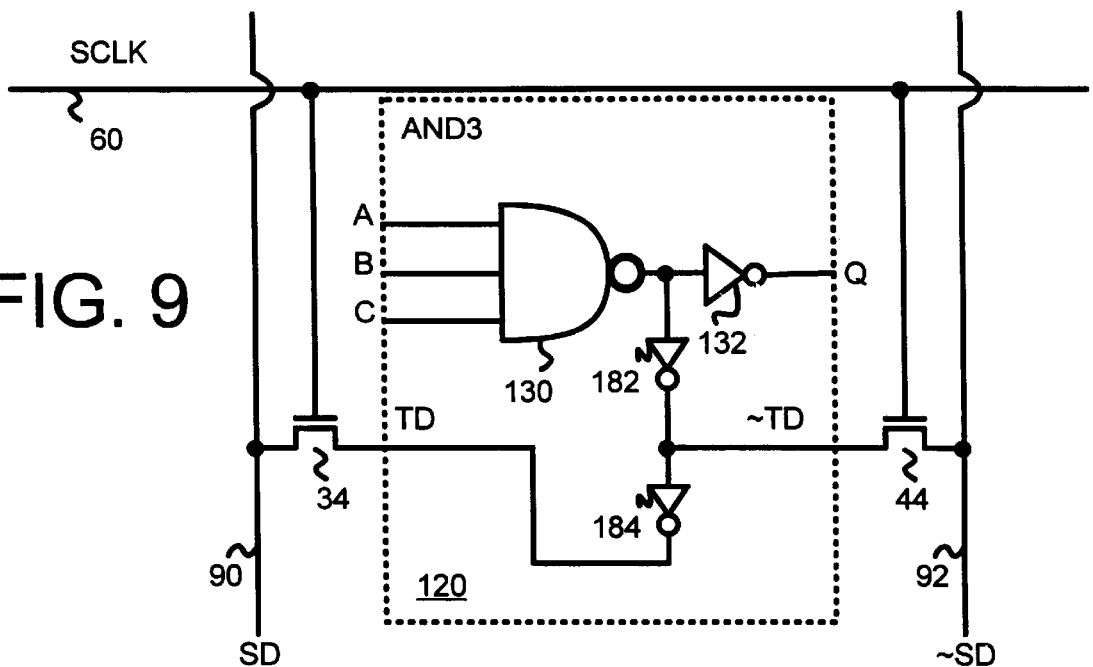
FIG. 9 is a diagram of an AND macrocell with differential test ports for observation.

FIG. 9 is a diagram of an AND macrocell with differential test ports for observation. Macrocell 120 is a combinatorial-logic cell without a storage element. NAND gate 130 receives three inputs to macrocell 120—A, B, C. The logical NAND of inputs A, B, C is input to inverter 132. Inverter 132 inverts the output from NAND gate 130 to produce the Q output from macrocell 120.

Inverters 182, 184 are small minimal-sized inverters to isolate the test inputs TD, ~TD from other logic in macrocell 120. Isolation using inverters 182, 184 reduces power consumption during scan since the charge on the scan-data bit lines is not connected to the output of NAND gate 130 or inverter 132, which are larger than inverters 182, 184 and thus burn more power when an intermediate voltage from the bit lines is applied to the output. The output from inverter 182 is connected to pass transistor 44 as the ~TD test port while the output from inverter 184 is connected to pass transistor 34 as the TD test port. The logical state of macrocell 120 can be read by activating scan-clock word line 60, but macrocell 120 cannot be written or loaded by the test hardware.

Figure 10:
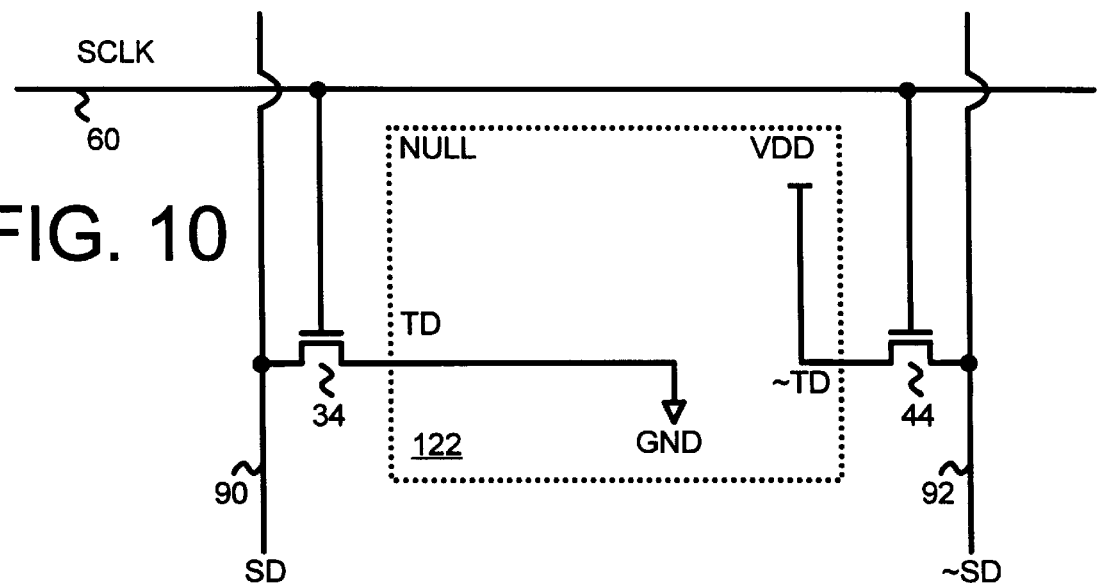
FIG. 10 shows a null macrocell which outputs a default value to the scan-data bit lines.

Occasionally a null or empty macrocell is located where the scan-data bit lines cross a row of macrocells, such as at the edge of a row of macrocells. A null connection can be made so that a logical value is output when the row is read. FIG. 10 shows a null macrocell which outputs a default value to the scan-data bit lines. Null cell 122 performs no logical function and is merely a placeholder in a row of macrocells. When scan-clock word line 60 is high it activates pass transistors in other non-null macrocells in a row of macrocells. Rather than leave scan-data bit lines 90, 92 for null cell 122 floating, it is desirable to put a default value on them so that test hardware outputs a deterministic value.

Pass transistor 34 is connected to test port TD, which is simply connected to ground inside null cell 122. Pass transistor 44 coupled to test port ~TD is connected to power inside null cell 122. Thus a low logical value is read from null cell 122 when scan-clock word line 60 is activated.

COLUMN OF MACROCELLS HAVE DIFFERENT CELLS AND WIDTHS

Figure 11:
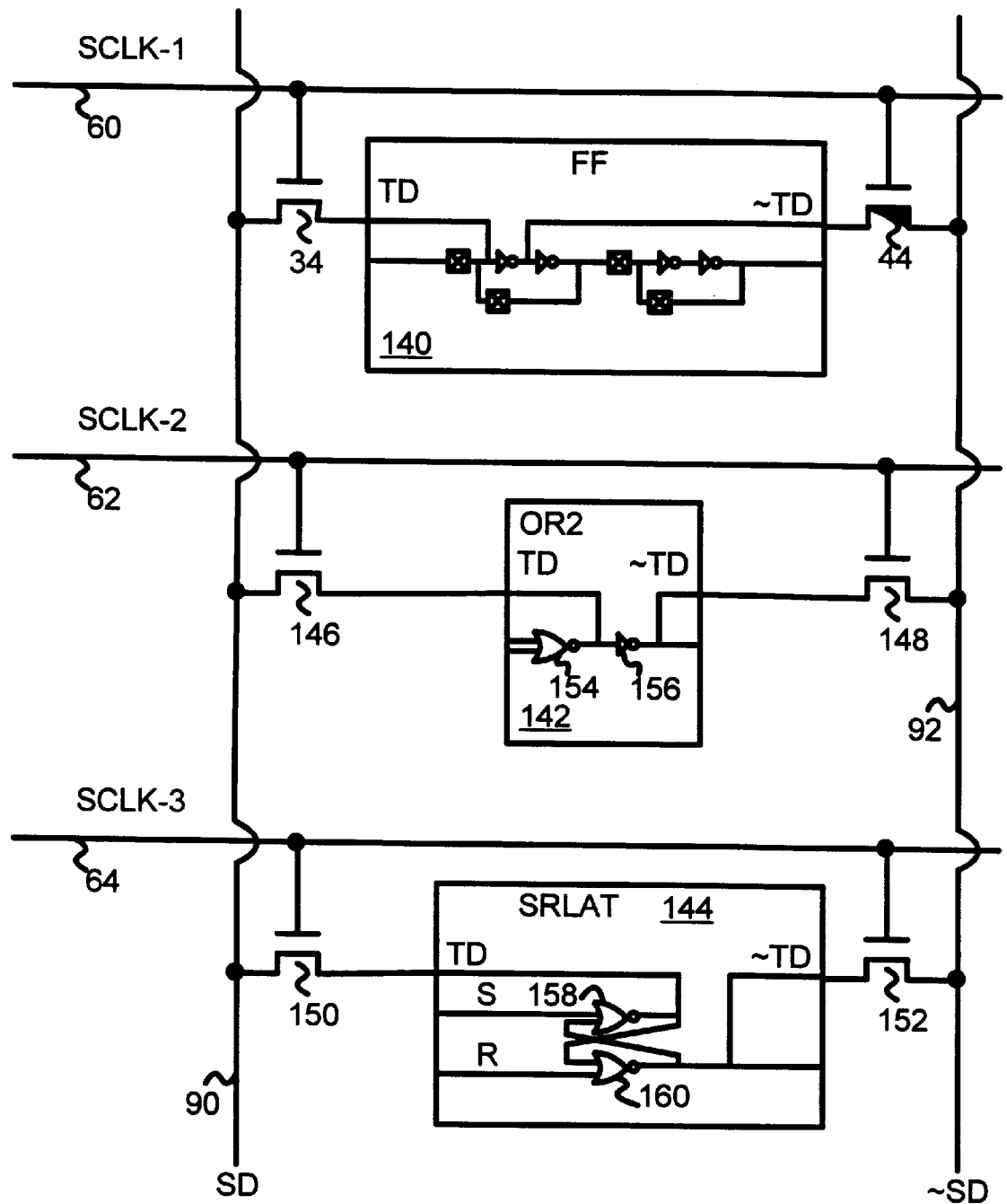
FIG. 11 is a diagram of a column of macrocells connected to a pair of bit lines in the RAM-like test structure.

FIG. 11 is a diagram of a column of macrocells connected to a pair of bit lines in the RAM-like test structure. Scan-clock word line 60 enables pass transistors 34, 44 to read or write macrocell 140, while scan-clock word line 62 enables pass transistors 146, 148 to read macrocell 142. Scan-clock word line 64 enables pass transistors 150, 152 to read or write macrocell 144. Scan-data bit line 90 connects to test ports TD through pass transistors 34, 146, or 150, while complement scan-data bit line 92 connects to test ports ~TD through pass transistors 44, 148, 152.

Macrocell 140 is an edge-triggered flip-flop macrocell. The master latch is connected to test ports TD, ~TD, although other embodiments could connect to the slave latch rather than the master latch of the flip-flop. Macrocell 142 is an OR cell, with test port TD connected to the output of NOR gate 154 while test port ~TD is connected to the output of inverter 156. Additional inverters for isolation are not included in macrocell 142 in this example. Macrocell 144 is an S-R latch. Test port TD is connected to the output of NOR gate 158, while test port ~TD is connected to the output of NOR gate 160, which is cross-coupled with NOR gate 158. To write macrocell 144 using scan, the set and reset inputs to NOR gates 158, 160 must be low (inactive).

FIG. 11 shows that a variety of macrocells can be connected together in a test column. The width of the macrocells in the column can vary, as can the function and type of macrocell. Storage and combinatorial-logic macrocells can be freely mixed in a column.

ROW DECODING, PRECHARGE, AND SENSE AMPLIFIERS FOR TEST ARRAY

Figure 12:
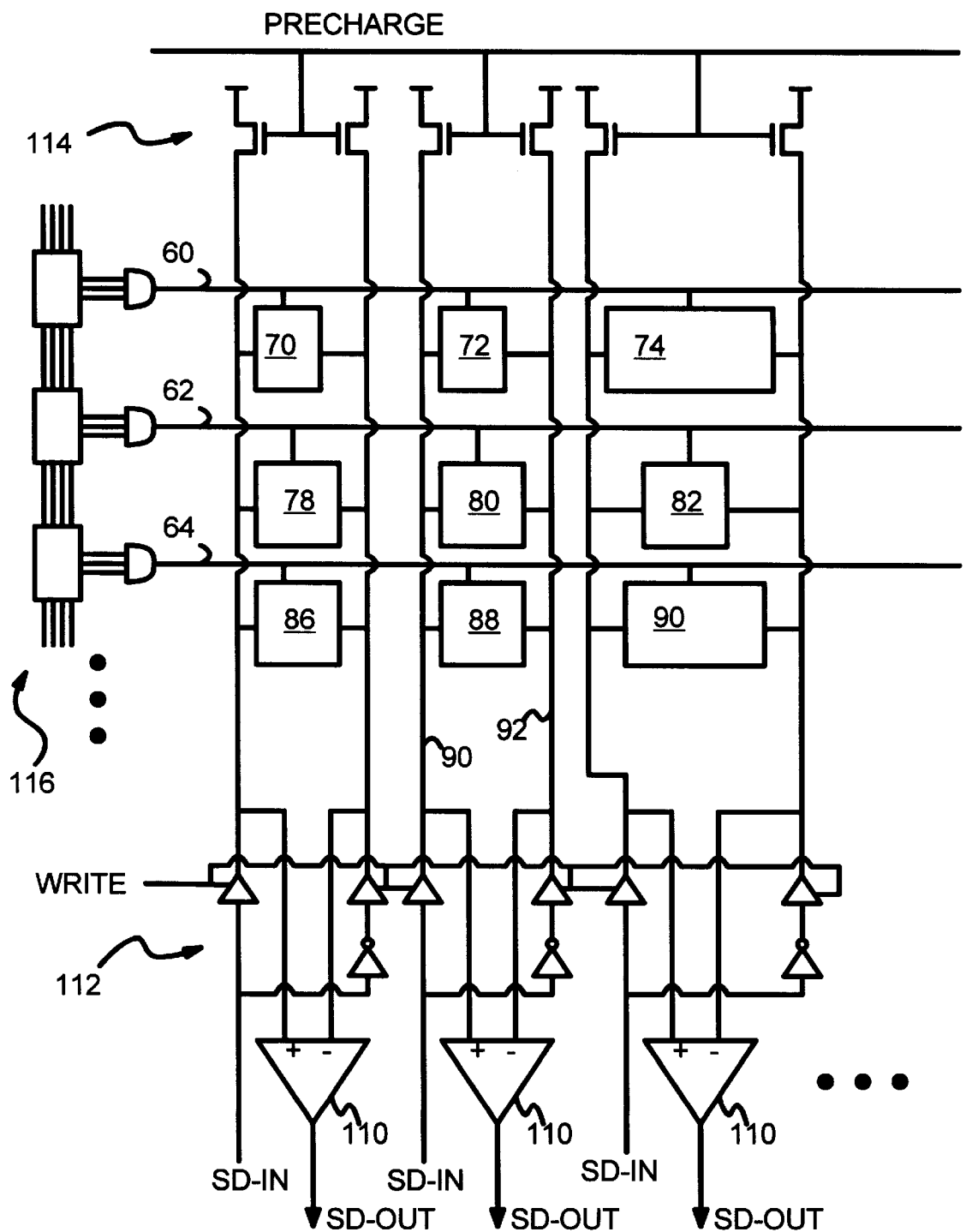
FIG. 12 is a diagram of a test array of rows of macrocells with row decode, precharge, sense amplifiers, and write-drivers connected to the word and bit lines.

FIG. 12 is a diagram of a test array of rows of macrocells with row decode, precharge, sense amplifiers, and write-drivers connected to the word and bit lines. Instead of a long scan chain which acts as a sequential-access shift register, a random-access test structure is used. A row address is received and decoded by row decoders 116 to activate only one of the rows of macrocells. The scan clock and perhaps a test-mode enable signal are ANDed with the decode, or are used to enable decoding. Row decoders activate no more than one of scan-clock word lines 60, 62, 64. The row address may be part of a more complex address identifying one of several units on a chip, and identifying a block inside the selected unit, and then identifying one row in the block. The unit could be a CPU core, while the block is a pipeline, or a cache, register file, floating-point processor, etc.

Precharge gates 114 initialize all columns of bit lines 90, 92 to an intermediate voltage such as Vdd–Vtn. Additional transistors (not shown) can be placed between each pair of bit lines 90, 92 to equalize the voltages on the pair of bit lines, as is well-known in the art. The precharge signal can be the inverse of scan clock SCLK, or a more complex timing signal.

Macrocells 72, 80, or 88 generate a small voltage difference on scan-data bit lines 90, 92 when one of the scan-clock word lines 60, 62, 64 is activated. This voltage difference on bit lines 90, 92 is amplified by sense amp 110 and converted to a full-voltage logic signal SD-OUT. CMOS sense amplifiers often use a pair of p-channel transistors connected to the power supply as a current mirror, connected to a pair of n-channel transistors with their gates connected to the bit lines. The source of the pair of n-channel transistors are connected together and to a current sink, such as another n-channel transistor to ground.

When it is desired to load scan data into the macrocells, the WRITE signal line is pulled high, enabling write drivers 112. When WRITE is low, write drivers 112 are disabled or placed in a high-impedance state. Write drivers 112 receive the true and complement of the scan-in data SD-IN. Write drivers are large compared to the pass transistors so they can easily over-power the cell's transistors.

Separate sense amplifiers and write drivers are provided for each pair of bit lines. Thus the macrocells can be read in parallel rather than in series. Parallel reading and writing improves test-program speed and thus reduces test cost.

LIMITATIONS

The macrocell must generate both a signal and its inverse for use with the invention. The invention uses two test ports with opposite logical values, which are connected through pass transistors to a pair of bit lines sensed by a sense amplifier. A macrocell without an inverse node can not be tested without adding an inverter to the macrocell. Thus non-inverting macrocells such as NAND, NOR, AND-OR-Invert, which are only one gate, do not generate a true and complement signal and cannot be tested. Of course, an inverted can be added to the cell to generate the inverse test port. However, often macrocells are buffered, having internal signals which are true and complement.

ADVANTAGES OF THE INVENTION

The invention is a very low-overhead technique to add testability to macrocells. Only two minimal-sized n-channel pass transistors are added to each macrocell. The efficiency of the test structure increases for larger arrays of macrocells in larger ASIC's because the sense amplifiers and row decoders are shared among more macrocells.

Previous scan-test structures have required adding an input mux and an output buffer, and perhaps a scan-output latch. A mux is typically equivalent to two gates (eight transistors), while a latch is 2–4 more gates. The two n-channel transistors occupy an area smaller than one gate. Since n-channel transistors have a higher carrier mobility than p-channel transistors, n-channel transistors are smaller for a desired current drive. Thus using two n-channel transistors is much more efficient than adding a mux having four p-channel and four more n-channel transistors.

Since a macrocell's area is often limited by the larger p-channel transistors, free space is often available in the p-well for the two n-channel transistors. Thus in many cases no additional area in the macrocell is required for adding the inventors' test structure. The invention is extremely miserly of silicon area as only two of the smaller n-channel transistors are added to make a macrocell testable.

The pair of pass transistors adds very little loading to the internal nodes of a macrocell. The source or drain capacitance of a small n-channel transistor is almost negligible compared to other capacitances such as gates of downstream logic. The small size of the pass transistors further reduces the capacitance added to the macrocell. Thus testability of a macrocell is added with minimal cost in loading and delay to the macrocell.

The speed of testing is increased since a whole row of macrocells can be read out or written to at once, in parallel. Scan-chain techniques require that data be serially shifted in and out, a slow process. Fast clear or set of macrocells is possible using the test structure, and the clear could be used in place of a microprocessor's normal reset sequence. Asynchronous set and clear inputs to flip-flops could be deleted, saving die area.

The size of the pass transistors can be kept near the minimum width, decreasing the area and cost necessary to add a test structure to a macrocell. The pass transistors can be made smaller than in a standard RAM because the access speed is not critical during test modes. Thus the RAM-like test structure can use smaller transistors than a high-speed RAM uses.

Scan chains require that the tested elements be latches or flip-flops, or that an additional scan latch be added to each element. The invention adds testability to non-flip-flop cells such as latches and even combinatorial logic and buffer cells. Thus logical signals can be observed as well as storage nodes. Data values on internal buses can be observed even when the bus is not latched. Control signals can also be observed, such as pipeline hold and release signals which are critical for proper operation of a microprocessor. Testing control signals in addition to storage elements improves test coverage and reliability.

Logic can be observed with scan during normal operation as long as scan writes are not performed. Thus tested nodes can be monitored during normal CPU operation. Even non-storage cells can be observed.

Dividing the microprocessor into separately-addressable rows of macrocells allows the tester or debugger to read or write just a small portion of all the test nodes on the chip. Test speed is dramatically improved compared to a long scan chain which requires shifting in bits to all test nodes in the chain, rather than just the nodes to be tested in the current test sequence. The invention allows testing to exercise only a particular portion of the chip and just read or write that portion rather than a whole scan chain. Less interesting portions of the chip can be skipped in favor of more interesting portions.

INVENTION SOLVES DI/DT PROBLEM FOR LONG SCAN CHAINS

Current spikes are a problem with long scan chains, since all flip-flops in the scan chain are clocked at the same instant by the scan clock. A scan chain of 10,000 flip-flops produces an unacceptably high di/dt. Slowing the frequency of the scan clock does not solve the problem because all flip-flops change the instant that a scan-clock edge occurs. The invention eliminates the current spike because only a smaller row of macrocells is read or written at any time. Other rows of macrocells are left idle.

The invention is well-suited for self-test capabilities since reading and writing test elements is performed in parallel rather than in series. See Applicant's co-pending application for "Self-Testing Multi-Processor Die with Internal Compare Points", U.S. Ser. No. 08/649,117.

The CPU clock can be electrically isolated (shielded) from other logic signals by the scan clock, scan data, and/or scan address signals. Since these scan signals change only during test modes, the scan signals are constant-voltage signals during normal mode and thus provide a good shield for the CPU clock. Previous scan chains could not provide this shielding because of the random placement of scan signals connecting flip-flops located everywhere. The invention has a regular structure with scan signals arrayed in a grid, rather than in a random, serpentine manner.

ALTERNATE EMBODIMENTS

Several other embodiments are contemplated by the inventors. For example the invention can be applied to many kinds of macrocells besides those shown in the examples. Many biasing schemes are known for RAM arrays and can be used with the invention. For instance, some RAMs actively bias the bit lines even during read, while other RAMs float the bit lines during read. The bias point of the bit lines can be adjusted for different kinds of sense amplifiers. N-channel pass transistors can be replaced with p-channel pass transistors and the biasing reversed so that one bit line swings high rather than low.

The latch macrocell design shown in FIG. 8 is preferable because the delay to the ~Q output does not depend on the cross-coupled inverters 100, 102. Since the n-channel pass transistors are connected to the cross-coupled inverters, the loading from the pass transistors is hidden from the latch's propagation delay. Other latch configurations are possible, although the test ports may increase delay through the latches.

The address can be extended to specify which macrocell in a row of macrocells is to be read using the address to mux the output of a row down to a single bit. On writing, all of the macrocells in a row must be written or loaded simultaneously. A write-data register can be provided to store the bits of data to be written to the row of macrocells. The write-data register is first loaded with the data to be scanned in, and then the scan clock is pulsed with a scan address for the desired row of macrocells.

Macrocells are the basic, smallest cell of an ASIC, Often macrocells are combined together into custom cells or other compound cells which are then arranged by place-and-route software. The invention can be applied to larger cells; even cells with multiple bits of state can be tested using multiple scan-bit data lines or multiple scan-bit word lines.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A test structure for an integrated circuit with rows of macrocells, the test structure comprising:

a pair of pass transistors connected to each macrocell tested by the test structure, the pair of pass transistors connected to a pair of complementary nodes in the macrocell, the pair of complementary nodes having opposite logical states during a test mode;

a plurality of test-mode word lines, each word line in the plurality of test-mode word lines connected to control gates of the pair of pass transistors for macrocells in one of the rows of macrocells;

a plurality of pairs of test-mode bit lines, each pair of test-mode bit lines connected to the pair of pass transistors for no more than one macrocell in each row of macrocells;

wherein the macrocells include latch macrocells containing just one storage latch, logical-gate macrocells containing at least one logic gate but no storage latches, and buffer macrocells containing no storage latches; and sensing means, connected to each pair of bit lines, for sensing a voltage difference across the pair of bit lines and outputting a test output signal representing a logical value corresponding to a logical state of a macrocell being read, whereby the test structure connects to macrocells through the pair of pass transistors, and whereby the latch, logical-gate, and buffer macrocells are tested by the test structure.

2. The test structure of claim 1 wherein only the pair of pass transistors are added to a macrocell for testing with the test structure, whereby only two transistors are added to each macrocell for testing.

3. The test structure of claim 2 wherein the sensing means comprises a sense amplifier for amplifying a small voltage difference, the small voltage difference being a few tenths of a volt.

4. The test structure of claim 3 further comprising:

pre-charge means, coupled to each pair of bit lines, for charging each bit line in each pair of bit lines to an intermediate voltage before a word line in the plurality of test-mode word lines is activated, the intermediate voltage being a voltage between a power-supply voltage and a ground, whereby the plurality of pairs of test-mode bit lines are pre-charged to the intermediate voltage prior to reading.

5. The test structure of claim 4 wherein each pair of pass transistors comprise two n-channel pass transistors having control gates connected to the word line and sources connected to the pair of bit lines.

6. The test structure of claim 5 wherein only one word line in the plurality of test-mode word lines is activated, wherein only one row of macrocells is read or written at a time in the rows of macrocells.

7. The test structure of claim 3 further comprising:

write drivers, connected to each pair of bit lines, for driving one bit line in the pair of bit lines to a high voltage and for driving the other bit line in the pair of bit lines to a lower voltage when a test-mode write is signaled, wherein a macrocell having a word line activated is loaded through the pair of pass transistors by the write drivers when the macrocell is a flip-flop macrocell or a latch macrocell.

8. The test structure of claim 7 wherein the logical state of a logical-gate macrocell is not altered when the test-mode write is signaled and the word line to the logical-gate macrocell is activated, whereby the logical-gate macrocell is observable but not loadable in the test mode.

9. The test structure of claim 8 wherein the logical-gate macrocells include macrocells for performing an AND logical function, an OR logical function, and an exclusive-OR (XOR) logical function, whereby AND, OR, XOR function macrocells are tested by the test structure.

10. The test structure of claim 9 wherein the plurality of pairs of bit lines are metal lines running in a perpendicular direction to the rows of macrocells.

11. The test structure of claim 10 wherein each word line is a metal line running over a single row of macrocells, wherein the word lines are perpendicular to the pairs of bit lines.

12. The test structure of claim 11 wherein the macrocells have variable widths, wherein the macrocells do not form constant-width columns of macrocells.

13. A testable central processing unit (CPU) comprising:

a data pipeline for processing general-purpose instructions;

rows of standard-logic library cells coupled to the data pipeline;

a RAM-like test structure superimposed over the rows of library cells, the RAM-like test structure having a grid of word lines and pairs of bit lines;

the library cells containing testable library cells, each testable library cell having a pair of pass transistors for connecting tested nodes inside the testable library cell to a pair of bit lines, the pair of pass transistors having their gates connected to a word line, at least one testable library cell located at each intersection of a word line and a pair of bit lines, the testable library cell being a standard-logic library cell, the testable library cell being a null cell when no standard-logic library cell is located at an intersection; wherein the null cell is a cell performing no logical function but connecting a first pass transistor in the pair of the pass transistors to a power supply and connecting a second pass transistor in the pair of pass transistors to a ground;

a word-line decoder for enabling a selected word line in response to a test address identifying a row in the rows of library cells for testing; and a sense amplifier for amplifying a small voltage difference between a pair of bit lines and outputting a test output signal, the test output signal indicating a state of a library cell at an intersection of the selected word line and the pair of bit lines;

wherein the pair of pass transistors is added to a library cell for testing with the RAM-like test structure.

14. The testable CPU of claim 13 wherein the pairs of bit lines are perpendicular to the rows of standard-logic library cells, and wherein the word lines are parallel to the rows of standard-logic library cells, whereby the pairs of bit lines and the word lines form a grid.

15. The testable CPU of claim 14 wherein the word lines are directly over the rows of standard-logic library cells.

16. The testable CPU of claim 14 wherein CPU clock signal lines are surrounded on both sides by the word lines or by the pairs of bit lines, whereby the CPU clock signal which operates in normal modes of operation is shielded by test-mode signals.

17. A method for modifying an integrated-circuit (IC) macrocell for testability, the method comprising the steps of:

identifying inside a macrocell which does not contain test circuitry a first node and a second node, the second node being a logical complement of the first node and identifying a storage element in the macrocell, the storage element being a bi-stable circuit with the first node and the second node being outputs of inverting logic gates which have their inputs cross-coupled to their outputs;

adding a first pass transistor and a second pass transistor to the macrocell; connecting a drain of the first pass transistor to the first node and connecting a drain of the second pass transistor to the second node;

connecting a source of the first pass transistor to a first scan-data bit line and connecting a source of the second pass transistor to a second scan-data bit line;

connecting a control gate of the first pass transistor and a control gate of the second pass transistor to a scan word line;

placing the macrocell in a row of macrocells in a layout for an integrated circuit and connecting the scan word line to pairs of pass transistors in other macrocells in the row of macrocells, the scan word line for enabling reading or writing of macrocells in the row of macrocells through the pairs of pass transistors during a test mode;

connecting the first and second scan-data bit lines to first and second scan-data bit lines in testable macrocells in other rows of macrocells; and connecting the first and second scan-data bit lines to a sense amplifier for sensing and amplifying a small voltage difference between the first scan-data bit line and the second scan-data bit line when the first and second pass transistors are activated by the scan word line, whereby the first and second pass transistors are added to the macrocell for reading or writing the macrocell during the test mode.

18. The method of claim 17 wherein the step of identifying the first and second nodes comprises identifying when no storage element is in the macrocell, identifying as the first node an input of an inverting logic gate and identifying as the second node an output of the inverting logic gate.

* * * * *